United States Patent [19]

Chien

[11] Patent Number: 5,314,988

[45] Date of Patent: May 24, 1994

[54] THERMALLY STABLE HIGHLY SENSITIVE RESISTS AND THE LIKE

[75] Inventor: James C. W. Chien, Amherst, Mass.

[73] Assignee: Academy of Applied Science, Inc., Concord, N.H. ; a part interest

[21] Appl. No.: 724,435

[22] Filed: Jul. 1, 1991

Related U.S. Application Data

[63] Continuation of Ser. No. 155,919, Feb. 16, 1988, abandoned.

[51] Int. Cl.[5] ..................... C08G 69/26; C08G 73/10
[52] U.S. Cl. .................................... 528/353; 528/125; 528/126; 528/128; 528/170; 528/172; 528/173; 528/176; 528/185; 528/188; 528/220; 528/229; 528/352; 522/164; 430/281; 430/283
[58] Field of Search ............... 528/125, 126, 128, 176, 528/170, 172, 173, 185, 188, 220, 229, 352, 353; 430/281, 283; 522/164

[56] References Cited

U.S. PATENT DOCUMENTS

| | | | |
|---|---|---|---|
| 3,356,648 | 12/1967 | Rogers | 528/352 |
| 3,658,938 | 4/1972 | Kwiatkowski et al. | 528/172 |
| 3,803,081 | 4/1974 | Lubowitz | 528/172 |
| 4,063,984 | 12/1977 | Critchley | 528/353 |
| 4,526,838 | 7/1985 | Fujioka et al. | 528/125 |
| 4,666,735 | 5/1987 | Hoover et al. | 430/417 |

OTHER PUBLICATIONS

"Poly(arylene Imide)s as E-Beam Resist: Sensitivity and Resolution", Journal of Polymer Science, Part A: Polymer Chemistry, vol. 27, pp. 3343-3352, (1989), Chien et al.

*Primary Examiner*—John Kight, III
*Assistant Examiner*—P. Hampton-Hightower
*Attorney, Agent, or Firm*—Rines and Rines

[57] ABSTRACT

A process for forming a polymer (and the polymer formed thereby) for passivation, resist and bonding uses, for example, that is thermally stable at relatively high temperatures in excess of 400° C., but is sensitive to electromagnetic radiation. The process includes forming a heteroatom ring polymer that includes a chain formed of a large number of closed aromatic rings such as polyimide groups. According to the present teaching, intervening moieties, (that is, chemical groupings) in the form of open ring precursors of the aromatic rings, such as polyamic acid groups are introduced between the successive closed aromatic rings, which destroy and/or delimit the colinear character and the coplanar character typical of the successive aromatic rings, thus rendering the aromatic rings sensitive to structural change by electromagnetic radiation exposure, and soluble in common organic solvents, but with the exposed HRP insoluble in resist developers.

10 Claims, No Drawings

THERMALLY STABLE HIGHLY SENSITIVE RESISTS AND THE LIKE

This application is a continuation of parent application Ser. No. 07/155,919, filed Feb. 16, 1988 now abandoned.

The present invention relates to novel polymeric materials which, among other things, possess radiation sensitivities to be useful as either positive or negative resist, as well as the unusual attributes of extreme thermal and plasma stabilities needed for passivation of large-scale integrated circuitry (LSIC) devices and the like, as well as device bonding.

BACKGROUND

Advances in microelectronic lithography have been made possible with high sensitivity resists. The approach has reached certain inherent limits. Polymers sensitive to radiation are also susceptible to thermal and plasma degradations. The latter properties are needed, among other things, for baking and dry etching processes in the manufacturing of the LSIC devices. Furthermore, as the separation between circuit elements decreases, electrical shorting can occur in the presence of moisture and sodium ions. This occurrence can be reduced by coating the LSIC device with a passivating film. As the passage of current generates a lot of heat, the passivating polymer film must possess high thermal stability. These divergent properties have not heretofore been found in any single polymer. Thus, as radiation sensitive polymers having low thermal stability have been employed as resists, thermally stable polymers such as conventional polyimides have been proposed to passivate the LSIC device. The present inventor has found, as later discussed, that certain new families of polymers can be rendered radiation sensitive in the sense of lithographic resists-yet, these materials are stable thermally at temperatures up to and above 400° C. and to plasma etching.

There have been numerous polymeric substances used in resist lithographic applications. They can, as noted above, act in the positive or negative mode depending upon the type of images formed. Some are operative only with light which includes visible and ultraviolet and will be referred to as photoresist, while others are operative with high energy radiations such as X-ray, electron and γ-ray which are commonly referred to as E-beam resists.

Existing resist materials suffer from any one or several disadvantages: (a) low $T_g$ (glass transistion temperature) limiting prebaking and postbaking conditions; (b) weak mechanical strength or adhesion to resists leading to the formation of line or pin-hole defects; (c) degradation by plasma in the process of dry etching. The resists of this invention usually do not exhibit glass transitions even at the very high decomposition temperatures. The resists of this invention are soluble in common organic solvents for spin coating to form micron thick films, but they can form thicker films of, say, forty or more microns. The films thus formed are mechanically strong and adhere strongly to a substrate. The novel resist polymers of this invention have been shown to be unusually stable in the environment of plasma typically employed for dry etching to remove the metal oxides surface layer of a substrate.

Heteroatom ring polymers (HRP) are characterized by excellent mechanical strength and chemical stabilities. Even though HRP structures are not easily soluble, they have been considered as a passivating layer for LSIC. But the chemical inertness of the HRP structures renders HRP unsuited, up to now, for resist applications. One would not look at these stable structures for resist applications, which require chemical transformations in the presence of radiation. It is worthy of mentioning that Scrinivasan was able to abrade polyimide with a high-intensity laser beam at an intensity level that can also affect steel. (Lecture by R. Scrinivasan, presented at the International Conference on Polymer Degradation and Stabilization, Manchester, England, 1986.)

The novel concept of this invention is to incorporate an X moiety between aromatic rings, the said moiety being radiation sensitive, which disrupts the colinear and coplanar characteristics of successive aromatic rings, yet is highly thermal stable.

The invention is described herein mostly in the context of resists but it has uses, as above noted, in a passivating function and, in addition, by adding conductive powders thereto (e.g., gold or silver flakes), can be utilized for conductive device bonding, especially in cerdip packages in the integrated circuit field of technology. Heat transfer characteristics can be enhanced by the adding of ceramic materials and the like such as aluminum and berrillium oxides. In all these environments, viscosity is a factor for it affects the thickness of polymer deposition which may be one to several microns for a resist and up to forty or more microns for passivation of memory devices. The present polymers can be employed in the several environments, including device bonding, all of which require heat-stable characteristics (that is, greater than 400° C. and, more importantly, about and above 450° C.). Further, whereas resists for semiconductor fabrication are emphasized herein, the polymeric materials herein disclosed can be used in other lithographic applications.

OBJECTS OF INVENTION

Accordingly, it is an object of the present invention to provide novel resists for use in the manufacturing of LSIC or other electronic devices and for any and all lithographic applications.

Another objective is to provide a resist that has a high glass transition temperature ($T_g$) in excess of 400° C. and up to and above 450° C.

Another objective is to provide a resist that is thermally stable in the absence of air at temperatures in excess of 400° C.

Another objective is to provide a resist that can be cast, such as by solution spinning into mechanically strong films a few microns thick and even forty microns thick.

Another objective is to provide a resist that is strongly adhesive to inorganic substrates such as metals, i.e., Al, Chrom steel, etc., or nonmetallic substances, i.e., Si, $SiO_2$, GaAs, etc.

Another objective is to provide a resist which is appreciably stable to plasma, i.e., $CF_4/O_2$, commonly used in dry etching of oxide surfaces of a substrate.

A further objective is to provide a resist that is impermeable to positive and negative ionic species and to moisture.

A still further objective is to provide both positive and negative resists with the foregoing characteristics.

A still further objective is to provide a material test that is useful as a resist but has other uses as well.

These and still further objectives are addressed hereinafter.

SUMMARY

The foregoing objectives are attained, generally, in a polymeric material in the form of heteroatom ring polymers (HRP) that include a string formed of a large number of successive aromatic rings with intervening moieties (Ar, Ar' hereinafter) that destroy and/or delimit the colinear character and the coplanar character typical of the successive aromatic rings, thus rendering the string sensitive to the structural changes by the radiation of the type mentioned above, create latent images of integrated electrical circuits, yet thermally stable at temperatures used to create the integrated circuits. The invention also resides in the process of making a resist or the like and using the same.

As later explained, the discovery underlying the invention of novel high-temperature thermally stable polymers that can be embued with radiation-responsive resist properties, requires, first, a combination HRP chain containing, for example, a certain small number of such intervening moieties such as open-ring amic acid ring precursor units (later represented by the symbol "I"), combined with aromatic rings such as closed-ring polyimide groups (later symbolized as "II"). By open-ringed is meant that the amide and carboxylic groups are unconnected, as subsequently more fully explained; whereas the imide portion has the amide and carboxylic groups connected (closed-ringed). Secondly, upon the exposure to radiation (such as UV or EB radiation), the condensation elimination of water acts on the open-ring amic units to close those rings and thereby render the total HRP an imide, which is insoluble to common developers (such as the later mentioned mixture of DMF and i-propanol, Table II, for example). The presence of the interposed open ring precursor component I is largely responsible for the HRP to exhibit the resist properties; and the latent image is developed by the usual well-known microlithogrophy techniques, leaving behind a completely imidized passivating layer.

DESCRIPTION OF PREFERRED EMBODIMENTS

The contribution of the present invention, thus, is the incorporation of radiation and photosensitive moieties; that is, chemical groupings, which disrupt the colinearity and coplanarity of the rings in the backbone of the HRP structures and thereby enhance adhesive interations with substrates. All these are achieved without significant adverse effects on the high-temperature stabilities of the HRP structure, and in most instances not at all.

The compounds of the present invention are the step growth polymers or repeating units having the general structure in expression (1):

$$-Ar-[Z-Ar'-Z]. \quad (1)$$

Going from left to right the symbols are the following representations: Ar represents

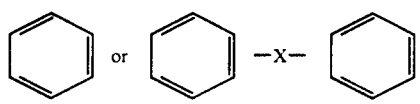

(2)

where Z includes

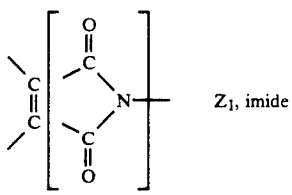  $Z_1$, imide

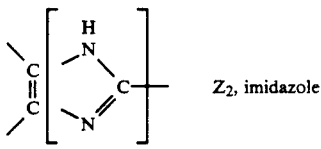  $Z_2$, imidazole (3)

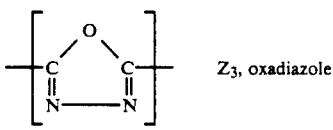  $Z_3$, oxadiazole

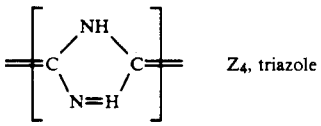  $Z_4$, triazole

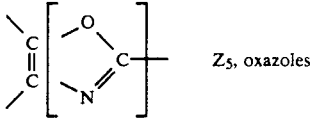  $Z_5$, oxazoles and Ar' represents (4)

where a is a small integer between 1 and 3 and the X in Ar' need not be the same as the X in Ar. The moieties include —O—,

—S—, —SO—, —SO$_2$—, —C$_n$F$_{2n}$— or C$_n$F$_{2n+1}$ (n=1 to 10) and even C—C single bond. By judicious choice of the X group in the moieties Ar and Ar', the best combination of desirable properties for a resist material can be optimized. The molecule weights of HRP of this invention are those typically obtained by persons practicing the art in the range of 5,000 to 100,000 required for physico-mechanical strengths.

Table I below gives a partial list of the HRP polymers which are active to deep ultraviolet (UV), E-beam and gamma radiations. Embodied in Table I are two unexpected and important discoveries. The first is that some HRP resists act posibtively and others negatively. Though the reasons of this interesting discovery are unknown, the inventor believes that this may be dictated by the choice of the developer. If this holds true, then the resists of this invention can act both in the negative and the positive modes, which characteristics would greatly facilitate the manufacturing of a multilayer LISC. The technological and economical ramifications of the invention are very broad indeed.

The HRP polymers are typically synthesized in two stages. In the first stage, the monomeric reactants undergo intermolecular condensation. This is illustrated with pryomellitic dianhydride and phenylene diamine.

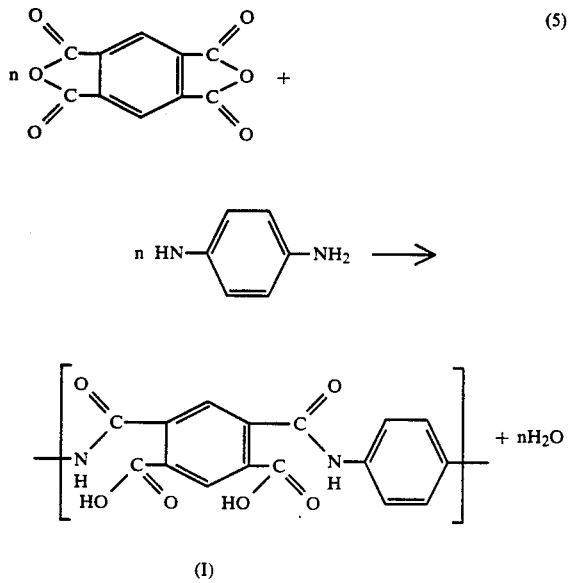

(I)

The product is a polyamic acid I with open rings—that is, the

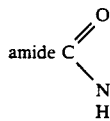

is unconnected from the

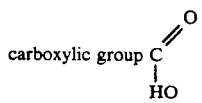

in the above equation (5). This is sometimes referred to herein as a precursor or B-stage resin.

The corresponding polyimide is then obtained by complete intramolecular condensation by heating. This results in the following polyimide:

 (6)

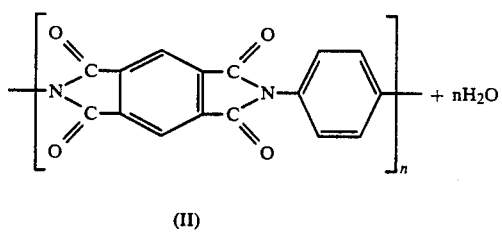

(II)

The same principle applies to all the HRP mentioned above.

The second discovery is that the HRP chain should contain a certain small amount of amic acid (open-ring) precursor units $\underset{\sim}{I}$ in the mainly imide closed-ring chain, wherein the amide and carboxylic groups are connected or close-ringed.

This is why, in Table I, later presented, the structural units for Z contain both the closed-ring imide units $\underset{\sim}{II}$ and the open-ring amic acid precursor units $\underset{\sim}{I}$. Though the amount of the latter may be small and it is variable from one particular HRP to another, its presence is largely responsible for HRT to exhibit resist properties. Radiation completes the ring closure of the open-ringed amic acid units or moieties—equation (6) showing that the amide and carboxylic groups have become connected (close-ringed) through condensation elimination of $H_2O$, thus rendering the exposed portion of the resin insoluble in the developer. The results given in Table II show the importance of the small percentage of open-ring precursor, wherein good-to-excellent radiation exposure resolution and best sensitivities are shown only and critically to be attainable with about 75-98 percent closed ring imide and the much smaller remaining percentage of the open-ring precursor amic acid. Therefore, the HRP of this invention are in fact copolymers, and herein all HRP implies and explicitly includes the corresponding copolymers. Simple homopolymers of the HRP containing only the precursor B-stage structure or only the completely condensed structure are not useful as resist materials.

The resolution of the HRP resists have been investigated with scanning electron microscopy. The best materials have better than 0.5 mm resolution. The actual achievable resolution will be even much finer if the conditions, i.e., irradiation, etching, developing, etc., are optimized and performed in a precisely controlled manner for the manufacturing of LSIC.

Other tests have been performed on the HRP of this invention. These included thermal stability using thermogravimetric analysis under helium and oxidative stability under oxygen, adhesion by peel test, and stability toward plasma using a plasma etching apparatus and 96% $CF_4$/4% $O_2$. The various stabilities of HRP are comparable to or slightly less than the corresponding polymers without the X groups while the adhesions are equal to or better by comparison.

Before mentioned Tables I and II follow:

TABLE I

Examples of HRP Resists

| Designation HRP | Ar | Structural Units Z | Ar' | Image |
|---|---|---|---|---|
| 1 | (CF₃)₂C with two dimethylphenyl groups | polyimide/polyamic acid unit | —⟨ ⟩—O—⟨ ⟩— | negative |
| 2 | " | " | —⟨ ⟩—SO₂—⟨ ⟩— | negative |
| 3 | " | " | —⟨ ⟩—S—⟨ ⟩—SO₂—⟨ ⟩—S—⟨ ⟩— | negative |
| 4 | " | " | —⟨ ⟩—SO₂—⟨ ⟩—SO₂—⟨ ⟩—SO₂—⟨ ⟩— | negative |
| 5 | " | " | —⟨ ⟩—C(CF₃)₂—⟨ ⟩— | negative |
| 6 | phenyl | " | —⟨ ⟩—O—⟨ ⟩— | negative |
| 7 | " | " | —⟨ ⟩—SO₂—⟨ ⟩— | positive |
| 8 | " | " | —⟨ ⟩—S—⟨ ⟩—SO₂—⟨ ⟩—S—⟨ ⟩— | negative |
| 9 | " | " | —⟨ ⟩—SO₂—⟨ ⟩—SO₂—⟨ ⟩—SO₂—⟨ ⟩— | negative |
| 10 | " | " | —⟨ ⟩—C(CF₃)₂—⟨ ⟩— | negative |

TABLE II

Effect of Copolymer Content

| HRP | % Imide | Sensitivity ($\mu C\ cm^{-2}$) | Resolution | Contrast | Developer (ratio)* |
|---|---|---|---|---|---|
| 7 | 0–69 | poor | — | — | |
| " | 87 | 7 | good | 1.9 | 2:1 |
| " | 97 | 8 | " | 1.0 | 1:0 |
| " | 100 | 10 | " | 1.7 | 1:0 |
| 1 | 0 | 7.0 | poor | — | 1:20 |
| " | 62 | 8.0 | good | 0.96 | 1:3 |
| " | 81 | 5.0 | good | 0.89 | 1.25 |
| " | 90 | 1.5 | excellent | 1.32 | 1:1 |
| " | 97 | 2.0 | poor | 1.1 | 1:0.5 |
| " | 100 | poor | — | — | 1:0 |
| 2 | 0 | poor | — | — | 1:20 |
| " | 36 | 10 | poor | — | 1:4 |
| " | 75 | 5 | good | 1.127 | 1:3 |
| " | 92 | 2.5 | excellent | 1.12 | 3:4 |
| " | 98 | 3 | excellent | 1.0 | 1:1 |
| " | 100 | 2.3 | good | 0.9 | 2:1 |

*The developer is a mixture of DMF and i-propanol the volume ratios of which are given.

To recapitulate the discovery underlying the invention and its rather broad application, as before stated, very few polymeric materials possess radiation sensitivities useful as either positive or negative resists. The term "resist" is being used herein in its well-known definition in the integrated circuit and related art to mean materials that can undergo some chemical change when radiation impinges thereon that gives an unambiguous, clear indication or image of the points of radiation impact. As also earlier stated, before the discovery of the present invention, it was known that heteroatom ring polymers (HRP) had excellent chemical stabilities and chemical inertures that, indeed, directly contraindicated their possible use for resist applications which, to the contrary, demand ready chemical transformations in the presence of radiation.

Before the present invention, indeed, it was inconceivable to the inventor and others skilled in this art that an HRP could ever be a candidate to serve as a resist.

The totally unexpected discovery was that by incorporating a small number of the so-called Z group moieties (such as the polyamic acid precursor group) into the HRP between aromatic rings (such as the polyimide groups), the said moiety being radiation sensitive and the aromatic rings constituting preferably percentages in the 80-90% ranges (Table II), one could disrupt the colinear and coplanar characteristics of the successive aromatic rings and impart to the HRP, radiation sensitive resist properties and qualities, but yet maintain such highly thermally stable. That incorporation of the Z group most unexpectedly transformed the properties of the HRP in the following particulars;

a. It became soluble, while HRPs are not.
b. It could undergo chemical transformations when radiation is impinged thereon, whereas HRPs cannot.
c. It could therefore be used as a resist material which earlier HRPs could not.
d. The final product, after processing, startingly remains a thermally stable HRP.

Further modifications will occur to those skilled in the art and such are considered to fall within the spirit and scope of the invention as defined in the appended claims.

What is claimed is:

1. An HRP polymer radiation-sensitive resist having a repeating unit of the formula —Ar—[Z—Ar'—Z]—, wherein Ar is selected from the group consisting of

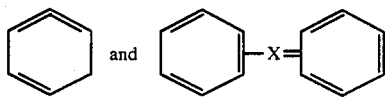

and Ar' represents

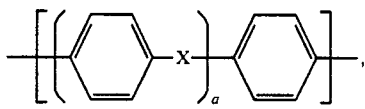

in which each X is individually selected from the group consisting of —O—, —S—, —SO—, SO$_2$, —C—, —C$_n$F$_{2n}$— and —C$_n$F$_{2n+1}$—, and a is a small integer between one and three, and Z is selected from the group consisting of closed ring imide groups combined in the polymer chain as about 75 to 98 percent of the same with the remaining smaller percentage of their corresponding open-ring precursor groups, such that the said polymer chain is converted from properties of radiation inertness, to properties of sensitivity to radiation so as to serve as a radiation resist, enabling the closing of the open rings of the said smaller percentage of open-ring precursor in response to radiation directed thereupon.

2. An HRP polymer as claimed in claim 1 and in which the values of the said closed ring Z component are of percentages in the eighties and nineties.

3. An HRP polymer as claimed in claim 1 and in which the same is combined with conductive powder selected from the group consisting of gold and silver.

4. An HRP polymer as claimed in claim 1 and in which the same is combined with ceramic materials selected from the group consisting of aluminum and berillium oxide.

5. An HRP polymer radiation-sensitive resist comprising (1) aromatic chain groups consisting of polyimide groups in which the constituent amide and carboxylic units have been connected through condensation of water to provide about 75-98 percent closed-ring groups, combined with (2) a much smaller group of intervening corresponding precursors such as polyamic acid groups in which the constituent amide and carboxylic groups are unconnected or open-ringed and wherein, upon exposure to radiation, the resulting water condensation renders the said precursors closed-ring, as by connecting said amide and carboxylic units, thus causing the HRP to serve a resist function, with the radiation-exposed polymer insoluble to resist developers, selected from the group consisting of DMP and i-propanol, and highly stable at temperatures of about 450° C. and above.

6. An HRP polymer radiation-sensitive resist as claimed in claim 5 and in which the aromatic chain groups constitute 80-90% of the HRP polymer.

7. A method of rendering radiation sensitive an aromatic chain selected from the closed ring group consisting of imide groups which are normally radiation inert so as to serve as a radiation resist, that comprises, combining the closed ring group in a polymer chain with their corresponding open-ring precursor groups; adjusting the percentage of the closed-ring group to be about 75-98 percent of the polymer chain; exposing the polymer chain to radiation to close the open ring in the open-ring precursor group creating the latent image of the radition exposure; and developing the latent image on the exposed polymer chain to remove all but the exposed portions.

8. A method as claimed in claim 7 and in which the 75-98 percent closed ring group is a polyimide group in which the constituent amide and carboxylic units have been connected through condensation of water to provide the closed ring structure, and the corresponding open-ring precursor is a polyamic acid group in which the constituent amide and carboxylic groups are unconnected prior to radiation.

9. A method as claimed in claim 7 and in which the developing is effected by a DMP solution in which only the said exposed portions are insoluble.

10. A method as claimed in claim 8 and in which the developed polymer chain becomes a completely imidized passivating layer.

* * * * *